US008263923B2

(12) United States Patent
Lee

(10) Patent No.: US 8,263,923 B2
(45) Date of Patent: Sep. 11, 2012

(54) 4T-4S STEP AND REPEAT UNIT PIXEL AND IMAGE SENSOR INCLUDING THE UNIT PIXEL

(75) Inventor: Do-Young Lee, Seongnam-si (KR)

(73) Assignee: Siliconfile Technologies Inc., Seoul (KR)

( * ) Notice: Subject to any disclaimer, the term of this patent is extended or adjusted under 35 U.S.C. 154(b) by 224 days.

(21) Appl. No.: 12/679,141

(22) PCT Filed: Oct. 14, 2008

(86) PCT No.: PCT/KR2008/006030
§ 371 (c)(1),
(2), (4) Date: Mar. 19, 2010

(87) PCT Pub. No.: WO2009/051379
PCT Pub. Date: Apr. 23, 2009

(65) Prior Publication Data
US 2010/0252718 A1    Oct. 7, 2010

(30) Foreign Application Priority Data

Oct. 15, 2007 (KR) .................. 10-2007-0103301

(51) Int. Cl.
*H01L 27/146* (2006.01)
(52) U.S. Cl. ............... 250/208.1; 250/214.1; 257/292; 257/E27.133
(58) Field of Classification Search ............... 250/208.1, 250/214.1; 257/291, 292, 443, E27.133, 257/E27.134
See application file for complete search history.

(56) References Cited

U.S. PATENT DOCUMENTS
2006/0038904 A1    2/2006  Kudoh
2007/0091190 A1    4/2007  Iwabuchi et al.
2009/0309008 A1*  12/2009  Lee ........................... 250/208.1

FOREIGN PATENT DOCUMENTS
KR    1020060062334 A    6/2006
KR    1020060068479 A    6/2006

OTHER PUBLICATIONS

PCT International Search Report of International Application No. PCT/KR2008/006030, Jul. 16, 2009.
PCT Written Opinion of the International Searching Authority for International Application No. PCT/KR2008/006030, Apr. 15, 2010.

* cited by examiner

*Primary Examiner* — Kevin Pyo
(74) *Attorney, Agent, or Firm* — Kile Park Goekjian Reed & McManus PLLC

(57) ABSTRACT

Disclosed are a 4T-4S step & repeat unit pixel used in an image sensor and an image sensor having the same. The 4T-4S step & repeat unit pixel has four diffusion area patterns for photodiodes and three diffusion area patterns for an image signal conversion circuit. An aperture ratio of the image sensor increases in maximum by using four photodiodes arranged in a diagonal direction from each other and three diffusion area patterns arranged between the photodiodes near their edges.

6 Claims, 13 Drawing Sheets

FIG. 2 (Prior Art)

4T-4S STEP AND REPEAT UNIT PIXEL AND IMAGE SENSOR INCLUDING THE UNIT PIXEL

BACKGROUND OF THE INVENTION

1. Field of the Invention

The present invention relates to a unit pixel of an image sensor, and more particularly, to a 4 transistors and 4 shared (hereinafter "4T-4S") step and repeat unit pixel obtained by combining four unit pixels into a single one and an image sensor having the same.

2. Description of the Related Art

An image sensor is obtained by arranging a plurality of unit pixels in a 2-dimensional array structure. A process of repeatedly arranging unit pixels in both of horizontal and vertical directions in a design stage of the image sensor is called a step & repeat process. In this process, a horizontal unit line is formed by repeatedly arranging a single type of unit pixels in a horizontal direction, and vertical unit lines are extended from each unit pixel of the horizontal unit line by repeatedly arranging the unit pixels in a vertical direction, thereby implementing a single image sensor.

A 4T unit pixel, a 4T-2S unit pixel, and a 4T-4S unit pixel, which will be referred herein can be defined as follows.

The 4T unit pixel includes a single photodiode and an image signal conversion circuit having four transistors (i.e., 4T) for processing image signals detected from the photodiode.

The 4T-2S unit pixel is an image sensor unit cell obtained by combining two 4T unit pixels into a single one by sharing the transistors (i.e., 2S) used for the image signal conversion circuit.

The 4T-4S unit pixel is an image sensor unit cell obtained by combining four 4T unit pixels into a single one by sharing the transistors (i.e., 4S) used for the image signal conversion circuit.

FIG. 1 illustrates a process of creating a conventional 4T-2S step & repeat unit pixel.

Referring to FIG. 1, the 4T-2S step & repeat unit pixel 100 shown in the right-hand side is obtained by combining two 4T unit pixels 10 and 20 shown in the left-hand side. A first unit pixel 10 includes a single photodiode PD1 and an image signal conversion circuit having four transistors M11, M12, M13 and M14 for converting the image signals generated from the photodiode PD1 into electrical signals. A second unit pixel 20 has a similar structure to the first unit pixel 10, but their components are denoted by different symbols in order to distinguish them from one another.

In the 4T-2S step & repeat unit pixel 100, a reset transistor M12 or M22, a conversion transistor M13 or M23, and a selection transistor M14 or M24 are shared between two 4T unit pixels 10 and 20, each of which has four transistors. Therefore, the number of transistors required for the reset, conversion, and selection transistors can be reduced to three if two 4T unit pixels share them, while six transistors are required if two 4T unit pixels are separately arranged as shown in FIG. 1. The 4T-2S step & repeat unit pixel 100 outputs a conversion voltage corresponding to the image signals generated in two photodiodes PD1 and PD2 using two transmission transistors M11 and M21 and three transistors MC2, MC3, and MC4 commonly shared.

The reset signal Rx12 applied to the gate of the reset transistor MC2 is enabled at a predetermined time point before either of the transmission control signal Tx1 or Tx2 applied to the gates of the transmission transistors M11 and M21 is enabled. The reference numeral "12" in the "Rx12" has been named for this reason. Similarly, the reference numeral "12" of the selection signal Sx12 applied to the gate of the selection transistor MC4 has been named for the same reason.

As described above, since a single common image signal conversion circuit is shared by two unit pixels, the image signals applied to two unit pixels are converted into electrical signals using two photodiodes and five transistors M11, M21, MC2, MC3, and MC4 in the 4T-2S step & repeat unit pixel 100. Therefore, the number of transistors required for each pixel becomes 2.5.

When four 4T unit pixels commonly share a single image signal conversion circuit, the number of transistors required for each pixel is reduced to 1.75. If other conditions are the same, the area that can be occupied by the photodiode increases in comparison to the above case in which only two 4T unit pixels commonly share a single image signal conversion circuit. This will improve the aperture ratio of the image sensor.

FIG. 2 is a circuit diagram of a conventional 4T-4S step & repeat unit pixel.

Referring to FIG. 2, a 4T-4S step & repeat unit pixel 200 includes four photodiodes PD0 to PD3 for generating image chares corresponding to incident image signals, four transmission transistors M21 to M24 for switching image charges generated from four photodiodes, and a common image signal conversion circuit having three transistors M25, M26, and M27 for converting the detected image charges into corresponding electrical signals. Transmission control signals Tx01, Tx11, Tx00, and Tx10 are applied to the gates of the transmission transistors M21, M22, M23, and M24, respectively.

Considering a general photodiode array in an image sensor, the 4T-4S step & repeat unit pixel 200 is obtained by combining into a single cell two photodiodes used to detect a green component from the image signals, one photodiode used to detect a blue component, and one photodiode used to detect a red component. Referring to FIG. 2, two photodiodes PD0 and PD3 used to detect a green component are diagonally arranged. The photodiode PD1 used to detect a blue component and the photodiode PD2 used to detect a red component are also diagonally arranged.

When the 4T-4S step & repeat unit pixel 200 is implemented in practice, the photodiodes are arranged in the same locations as those shown in the circuit diagram of FIG. 2. Therefore, the 4T-4S step & repeat unit pixel 200 has a square structure obtained by combining four most adjacent photodiodes.

FIG. 3 is a circuit diagram of another conventional 4T-4S step & repeat unit pixel.

Referring FIG. 3, the 4T-4S step & repeat unit pixel 300 includes four photodiodes PD0 to PD3 for receiving image signals, four transmission transistors M21, M22, M23, and M24 for switching image charges generated from the photodiodes PD0 to PD3, and a common image signal conversion circuit M25, M26, and M27 for converting the detected image charges into corresponding electrical signals. The transmission control signals Tx00, Tx10, Tx20, and Tx30 are applied to the gates of the transmission transistors M21, M22, M23, and M24, respectively.

When the 4T-4S step & repeat unit pixel 300 is implemented in practice, the photodiodes are arranged in the same locations as those shown in the circuit diagram of FIG. 3. Therefore, the 4T-4S step & repeat unit pixel 200 has a structure obtained by combining four photodiodes vertically disposed into a single cell. The 4T-4S step & repeat unit pixel 300 has a rectangular structure, and transmission control signals Tx00, Tx10, Tx20, and Tx30 are applied to the gates of the transmission transistors M21, M22, M23, and M24, respectively, connected to the four photodiodes.

Comparing the 4T-4S step & repeat unit pixels 200 and 300 of FIGS. 2 and 3 with each other, the 4T-4S step & repeat unit pixel 200 of FIG. 2 is formed by combining a total of four photodiodes arranged in two horizontal lines, each of which has two photodiodes, whereas the 4T-4S step & repeat unit pixel 300 of FIG. 3 is formed by combining four photodiodes arranged in series along a single vertical line. For this reason, the 4T-4S step & repeat unit pixel 200 of FIG. 2 requires the transmission control signals to be applied to two lines 0 and 1, while the 4T-4S step & repeat unit pixel 300 of FIG. 3 requires the transmission control signals to be applied to four lines 0, 1, 2, and 3.

As described above, since two photodiodes used to detect a green component are diagonally arranged, one of the photodiodes should be arranged in a first vertical line, and the other photodiode should be arranged in a second vertical line as shown in FIG. 2. Therefore, in the 4T-4S step & repeat unit pixel 200 of FIG. 2, proposed by Micron Technology, Inc., the photodiode for detecting a green component and the photodiode for detecting a red or blue component are alternately enabled. Accordingly, there may be errors in processing the green component, which is considered as a most important color component.

Generally, when a certain unit pixel is failed, a recovery algorithm may be applied to the image signals detected from other neighboring unit pixels in order to compensate for the failure as if it normally operates. On the other hand, since the 4T-4S step & repeat unit pixel 300 of FIG. 3, proposed by SAMSUNG Electronics, Inc., has a rectangular structure having pixels vertically connected in series, a conventional recovery algorithm cannot be applied without change when any unit pixel is failed. Therefore, a processing circuit should be redesigned in consideration of the aforementioned layout difference, and the size of the image sensor also increases.

SUMMARY OF THE INVENTION

The present invention provides a 4T-4S step & repeat unit pixel by which little error is generated during the processing of the green component and the conventional recovery algorithm can be applied to the failed unit pixel without change.

In addition, the present invention provides an image sensor including a plurality of 4T-4S step & repeat unit pixels having the aforementioned advantages.

According to an aspect of the present invention, a 4T-4S step & repeat unit pixel comprises diffusion area patterns for four photodiodes. A second photodiode diffusion area pattern is provided in an upper right diagonal direction from a first photodiode diffusion area pattern, and the upper right corner of the first photodiode diffusion area pattern and the lower left corner of the second photodiode diffusion area pattern are connected to each other by extension. A third photodiode diffusion area pattern is provided above the second photodiode diffusion area pattern. A fourth photodiode diffusion area pattern is provided in an upper left diagonal direction from the third photodiode diffusion area pattern over the first photodiode diffusion area pattern. The upper left corner of the third photodiode diffusion area pattern and the lower right corner of the fourth photodiode diffusion area pattern are connected to each other by extension.

According to another aspect of the present invention, a 4T-4S step & repeat unit pixel comprises four diffusion area patterns for photodiodes. A second photodiode diffusion area pattern is provided in an upper left diagonal direction from a first photodiode diffusion area pattern. A third photodiode diffusion area pattern is provided in an upper right diagonal direction from the second photodiode diffusion area pattern over the first photodiode diffusion area pattern. A fourth photodiode diffusion area pattern is provided in an upper left diagonal direction from the third photodiode diffusion area pattern over the second photodiode diffusion area pattern. Most adjacent corners of the first and second photodiode diffusion area patterns are connected to each other by extension, and most adjacent corners of the third and fourth photodiode diffusion area patterns are connected to each other by extension.

According to further another aspect of the present invention, there is provided an image sensor comprising a plurality of 4T-4S step & repeat unit pixels arranged in horizontal and vertical directions, each of unit pixels having: a first photodiode diffusion area pattern; a second photodiode diffusion area pattern provided in a diagonal direction from the first photodiode diffusion area pattern; a third photodiode diffusion area pattern provided above the second photodiode diffusion area pattern; and a fourth photodiode diffusion area pattern provided in a diagonal direction from the third photodiode diffusion area pattern over the first photodiode diffusion area pattern, wherein a green color filter is provided on top of the first and second photodiode diffusion area patterns, a red color filter is provided on top of the third photodiode diffusion area pattern, and a blue color filter is provided on top of the fourth photodiode diffusion area pattern in one of the 4T-4S step & repeat unit pixels, and wherein a red color filter is provided on top of the first photodiode diffusion area pattern, a blue color filter is provided on top of the second photodiode diffusion area pattern, and a green color filter is provided on top of the third and fourth photodiode diffusion area patterns in another neighboring 4T-4S step & repeat unit pixel.

According to still another aspect of the present invention, there is provided there is provided an image sensor comprising a plurality of 4T-4S step & repeat unit pixels arranged in horizontal and vertical directions, each of unit pixels having: a first photodiode diffusion area pattern; a second photodiode diffusion area pattern provided in a diagonal direction from the first photodiode diffusion area pattern; a third photodiode diffusion area pattern provided in a diagonal direction from the second photodiode diffusion area pattern above the first photodiode diffusion area pattern; and a fourth photodiode diffusion area pattern provided in a diagonal direction from the third photodiode diffusion area pattern over the second photodiode diffusion area pattern, wherein a green color filter is provided on top of the first, second, third, and fourth photodiode diffusion area patterns of one of the 4T-4S step & repeat unit pixels, and wherein a blue color filter is provided on top of the first and third photodiode diffusion area patterns while a red filter is provided on top of the second and fourth photodiode diffusion area patterns of another neighboring 4T-4S step & repeat unit pixel.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF PREFERRED EMBODIMENTS

Hereinafter, exemplary embodiments of the present invention will be described in detail with reference to the accompanying drawings.

Figure 4:
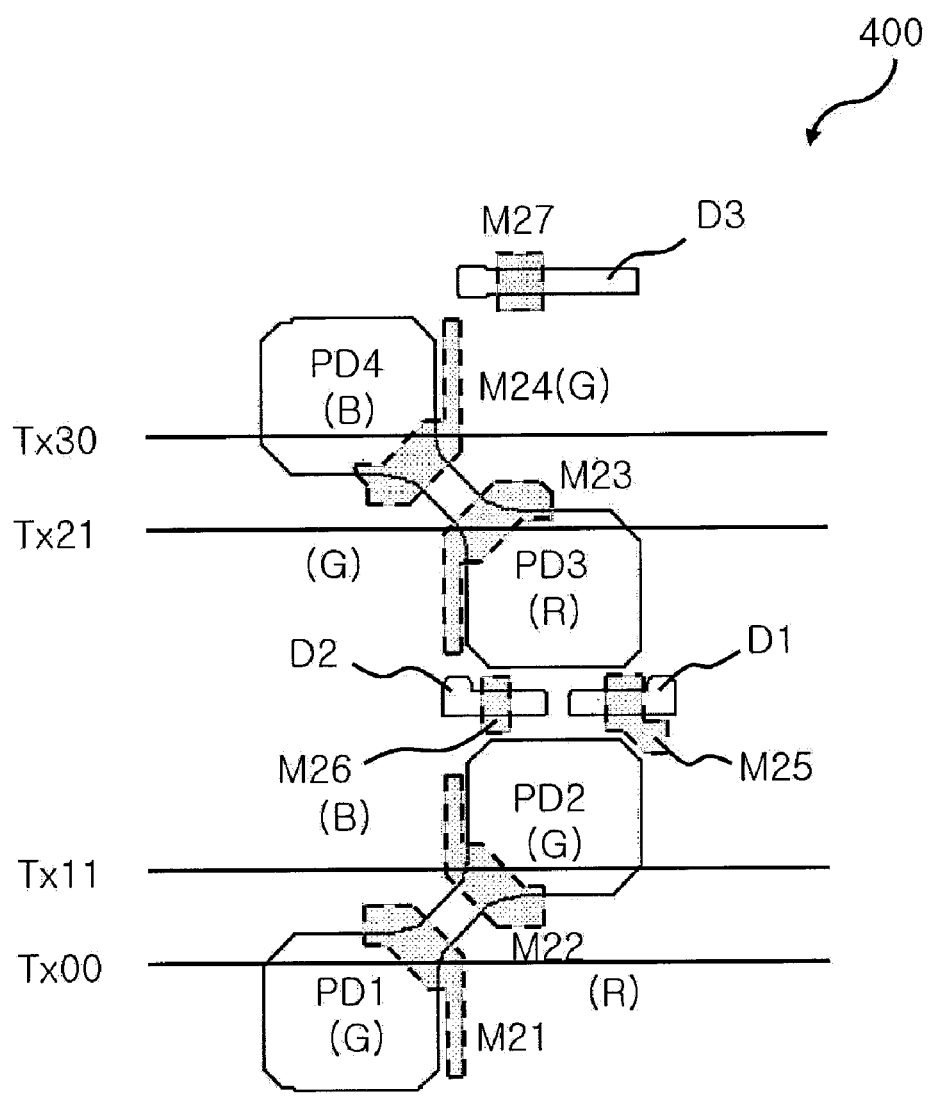
FIG. 4 is a layout of a 4T-4S step & repeat unit pixel according to the first embodiment of the present invention.

FIG. 4 is a layout of a 4T-4S step & repeat unit pixel according to the first embodiment of the present invention.

Figure 5:
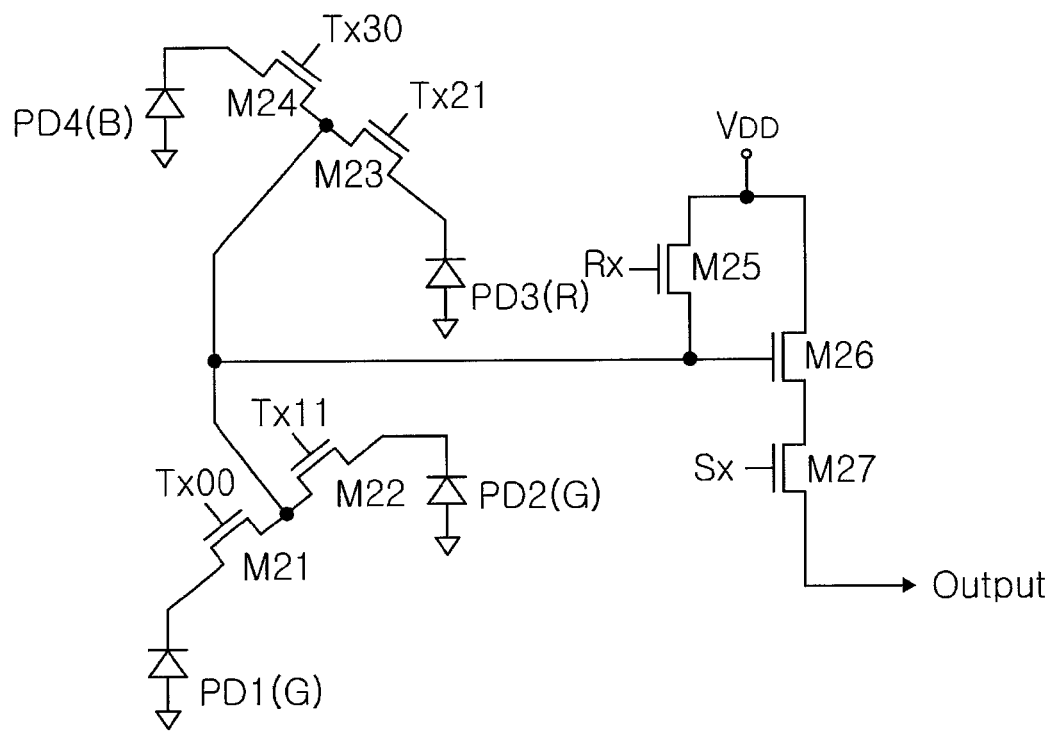
FIG. 5 is a circuit diagram of a 4T-4S step & repeat unit pixel of FIG. 4 according to the first embodiment.

FIG. 5 is a circuit diagram of the 4T-4S step & repeat unit pixel of FIG. 4 according the first embodiment.

Figure 1:
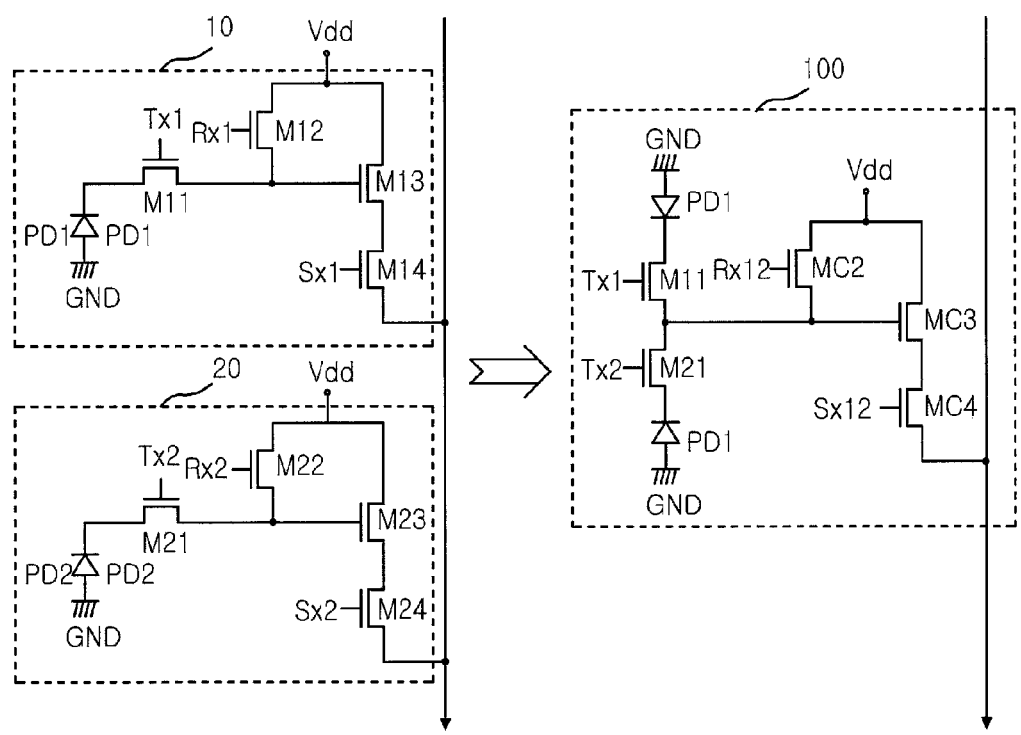
FIG. 1 illustrates a process of creating a conventional 4T-4S step & repeat unit pixel.
Figure 2:
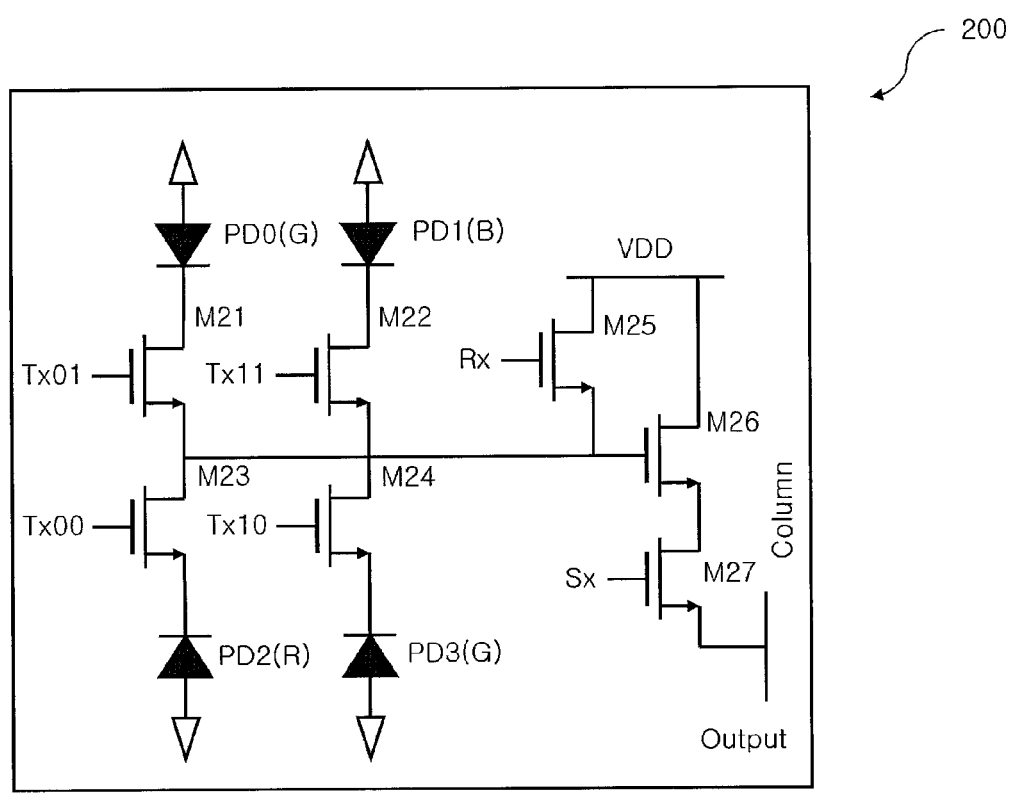
FIG. 2 is a circuit diagram of a conventional 4T-4S step & repeat unit pixel.
Figure 3:
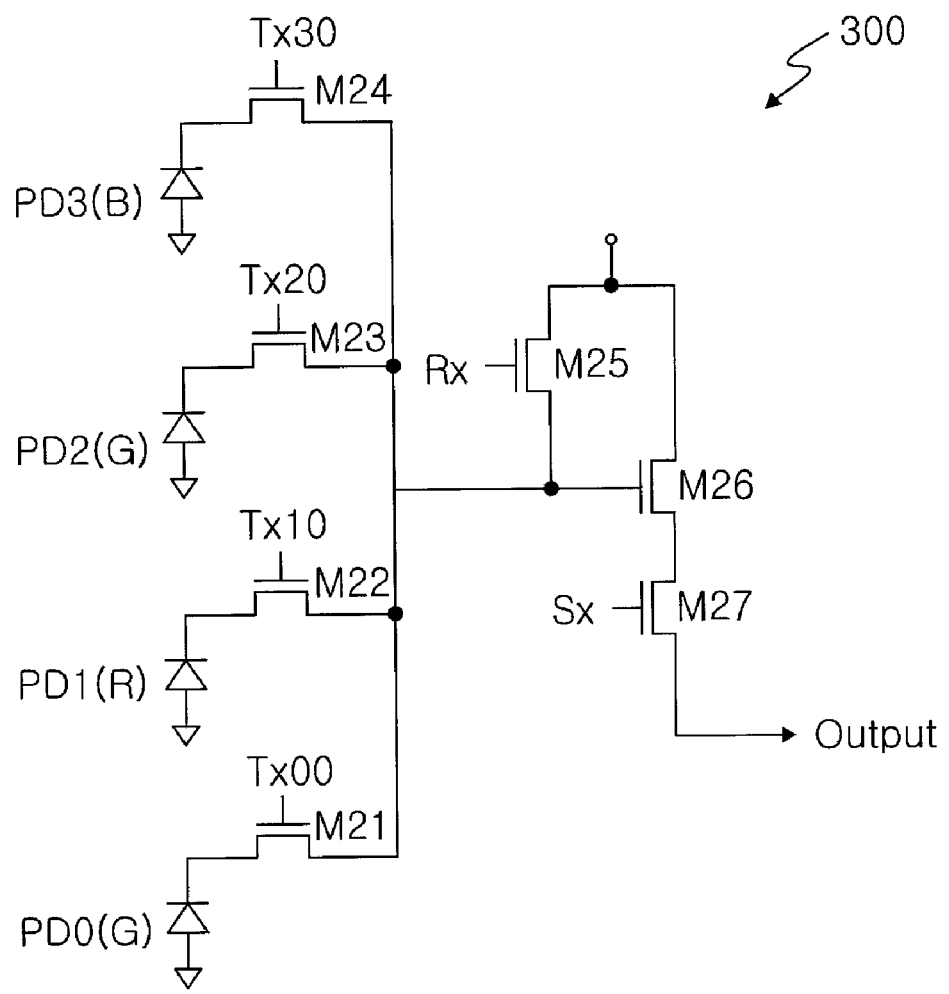
FIG. 3 is another circuit diagram of a conventional 4T-4S step & repeat unit pixel.

It should be noted that the circuit of FIG. 5 has been drawn in consideration of location relationship of the photodiodes of FIG. 4, and is not different from those of FIGS. 2 and 3 from the viewpoint of a circuit theory. Such a concept can be also applied to FIGS. 7, 9, and 11, which will be described later.

Referring to FIG. 4, diffusion area patterns PD1 to PD4 for four photodiodes and diffusion area patterns D1 to D3 for an image signal conversion circuit are defined by solid lines in the layout pattern of the 4T-4S step & repeat unit pixel according to the first embodiment. Four transmission transistors M21, M22, M23, and M24 are provided in portions where the photodiode diffusion area patterns PD1 to PD4 for the photodioes are connected to each other. Herein, the reference symbol G denotes a green color, the reference symbol R denotes a red color, and the reference symbol B denotes a blue color. This means the photodiode having a reference symbol R, G, or B in parentheses detects a corresponding color component from image signals. It should be noted that, hereinafter, although not specifically defined, this meaning will be consistently applied whenever the corresponding photodiode is referred regardless of whether the reference symbols R, G, and B are obviously marked or not.

In practice, color filters are provided on top of the photodiodes in order to allow each of the photodiodes to detect one of green, red, and blue components. That is, referring to FIG. 4, green color filters are provided on top of first and second photodiodes PD1 and PD2, and red and blue color filters are provided on top of third and fourth photodiodes PD3 and PD4, respectively.

The second photodiode diffusion area pattern PD2 is provided in an upper right diagonal direction from the first photodiode diffusion area pattern PD1. The upper right corner of the first photodiode diffusion area pattern PD1 and the lower left corner of the second photodiode diffusion area pattern PD2 are connected to each other by extension. The third photodiode diffusion area pattern PD3 is provided above the second photodiode diffusion area pattern PD2. The fourth photodiode diffusion area pattern PD4 is provided in an upper left diagonal direction from the third photodiode diffusion area pattern PD3 over the first photodiode diffusion area pattern PD1. The upper left corner of the third photodiode diffusion area pattern PD3 and the lower right corner of the fourth photodiode diffusion area pattern PD4 are connected to each other by extension.

The first diffusion area pattern D1 is provided between the second and third photodiode diffusion area patterns PD2 and PD3. The second diffusion area pattern D2 is provided between second and third photodiode diffusion area patterns PD2 and PD3 in the left side of the first diffusion area pattern D1. The third diffusion area pattern D3 is provided in an upper right diagonal direction from the fourth photodiode diffusion area pattern PD4 above the third photodiode diffusion area pattern PD3.

In FIG. 4, the gate patterns are defined by dotted lines. A gate pattern for the first transmission transistor M21 is provided near the corner of the first photodiode diffusion area pattern PD1, and a gate pattern for the second transmission transistor M22 is provided near the second photodiode diffusion area pattern PD2 in the extension between the upper right corner of the first photodiode diffusion area pattern PD1 and the lower left corner of the second photodiode diffusion area pattern PD2. A gate pattern for the third transmission transistor M23 is provided near the third photodiode diffusion area pattern PD3, and a gate pattern for the fourth transmission transistor M24 is provided near the fourth photodiode diffusion area pattern PD4 in the extension between the upper left corner of the third photodiode diffusion area pattern PD3 and the lower right corner of the fourth photodiode diffusion area pattern PD4.

The gate patterns for the reset transistor M25, the conversion transistor M26, and the selection transistor M27 are provided on the first, second, and third diffusion area patterns D1, D2, and D3, respectively.

Referring to FIGS. 4 and 5, after all processes are completed after forming the aforementioned gate patterns, first, second, third and fourth transmission control signals Tx00, Tx11, Tx21, and Tx30 are applied to the gates of the transmission transistors M21, M22, M23 and M24, respectively. In addition, a reset signal Rx is applied to the gate of the reset transistor M25. A common terminal of the transmission transistors M21, M22, M23 and M24 and a terminal of the reset transistor M25 are connected to the gate of the conversion transistor M26. A selection signal Sx is applied to the gate of the selection transistor M27.

The former of the reference numerals of the four transmission control signals denotes a horizontal line number, and the latter denotes a vertical line number. Therefore, the first transmission control signal Tx00 enables the first transmission transistor M21 located on the first horizontal line 0 and the first vertical line 0. Similarly, the second transmission control signal Tx11 enables the second transmission transistor M22 located on the second horizontal line 1 and the second vertical line 1, the third transmission control signal Tx21 enables the third transmission transistor M23 located on the third horizontal line 2 and the second vertical line 1, and the fourth transmission control signal Tx30 enables the fourth transmission transistor M24 located on the fourth horizontal line 3 and the first vertical line 0.

While the gates of the first, second, third and fourth transmission transistors M21, M22, M23, and M24 of the 4T-4S step & repeat unit pixel 400 of FIG. 4 are connected to four different signal lines Tx00, Tx11, Tx21, and Tx30, respectively, the gates of the first, second, third, and fourth transmission transistors M21, M22, M23, and M24 of the conventional 4T-4S step & repeat unit pixel 200 of FIG. 2 are connected to two different signal lines Tx0 and Tx1.

The 4T-4S step & repeat unit pixel 400 according to the present invention and the conventional 4T-4S step & repeat unit pixel 300 are similar to each other in that the gates of the first, second, third, and fourth transmission transistors M21, M22, M23, and M24 are connected to four different signal lines Tx0, Tx1, Tx2, and Tx3, respectively. However, the locations of the photodiodes are different as follows.

In the conventional 4T-4S step & repeat unit pixel 300 of FIG. 3, four photodiodes arranged across four horizontal lines 0 to 3 along a single vertical line 0 are combined into a single unit pixel. However, in the 4T-4S step & repeat unit pixel 400 of FIG. 4 according to the present invention, four photodiodes arranged across four horizontal lines 0 to 3 along two vertical lines 0 and 1 are combined into a single unit pixel. Since two photodiodes are arranged in a diagonal direction, the area between neighboring unit pixels increases in comparison with the unit pixel of FIG. 3. Therefore, even when the corresponding unit pixel is failed, the signals can be processed using a conventional recovery algorithm as if the failed unit pixel normally operates. It should be noted that the case the unit pixel is failed includes when all transistors are failed as well as when one of the transistors of the unit pixel is failed.

Figure 6:
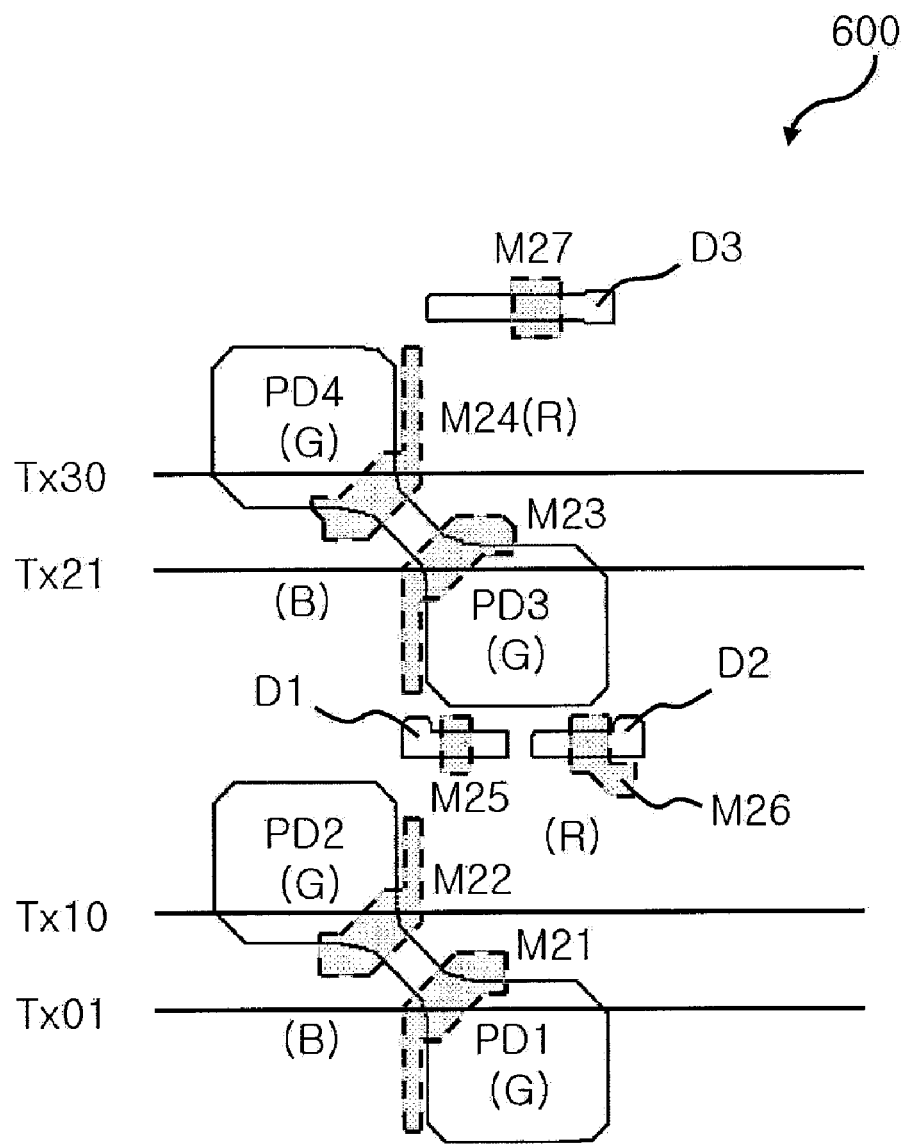
FIG. 6 is a layout of a 4T-4S step & repeat unit pixel according to the second embodiment of the present invention.

FIG. 6 is a layout of a 4T-4S step & repeat unit pixel according to the second embodiment of the present invention.

Figure 7:
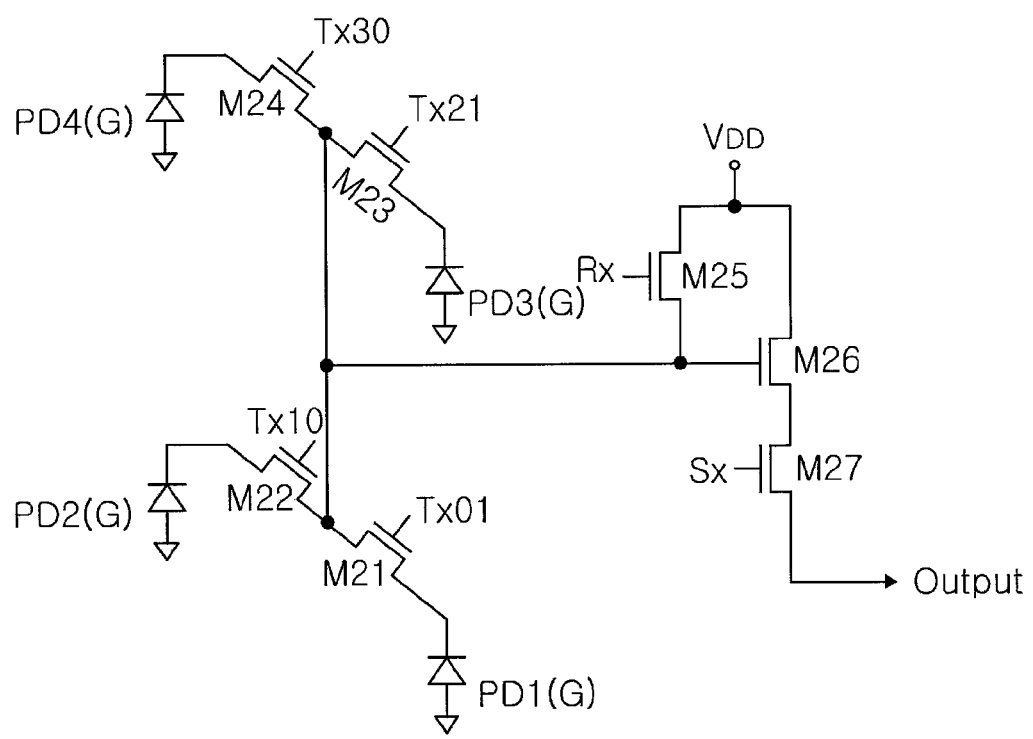
FIG. 7 is a circuit diagram of a 4T-4S step & repeat unit pixel of FIG. 6 according to the second embodiment.

FIG. 7 is a circuit diagram of the 4T-4S step & repeat unit pixel of FIG. 6 according to the second embodiment.

Referring to FIG. 6, diffusion area patterns PD1 to PD4 for four photodiodes and diffusion area patterns D1 to D3 for an image signal conversion circuit are defined by solid lines in the layout of the 4T-4S step & repeat unit pixel according to the second embodiment. Four transmission transistors M21, M22, M23, and M24 are provided across respective extensions of the photodiode diffusion area patterns PD1 to PD4.

The second photodiode diffusion area pattern PD2 is provided in an upper left diagonal direction from the first photodiode diffusion area pattern PD1. The third photodiode diffusion area pattern PD3 is provided in an upper right diagonal direction from the second photodiode diffusion area pattern PD2 over the first photodiode diffusion area pattern PD1. The fourth photodiode diffusion area pattern PD4 is provided in an upper left diagonal direction from the third photodiode diffusion area pattern PD3 over the second photodiode diffusion area pattern PD2.

The first diffusion area pattern D1 is provided in an upper right diagonal direction from the second photodiode diffusion area pattern PD2 below the third photodiode diffusion area pattern PD3. The second diffusion area pattern D2 is provided in an upper right diagonal direction from the first diffusion area pattern D1 below the third photodiode diffusion area pattern PD3. The third diffusion area pattern D3 is provided in an upper right diagonal direction from the fourth photodiode diffusion area pattern PD4 over the third photodiode diffusion area pattern PD3.

The upper left corner of the third photodiode diffusion area pattern PD1 and the lower right corner of the fourth photodiode diffusion area pattern PD2 are connected to each other by extension. Similarly, the upper left corner of the third photodiode diffusion area pattern PD3 and the lower right corner of the fourth photodiode diffusion area pattern PD4 are connected to each other by extension.

In FIG. 6, the gate patterns are defined by dotted lines. The gate pattern for the first transmission transistor M21 is provided near the corner of the first photodiode diffusion area pattern PD1, and the gate pattern for the second transmission transistor M22 is provided near the corner of the second photodiode diffusion area pattern PD2 across a common diffusion area pattern connecting the first and second photodiode diffusion area patterns PD1 and PD2 to each other by extension. The gate pattern for the third transmission transistor M23 is provided near the corner of the third photodiode diffusion area pattern PD3, and the gate pattern for the fourth transmission transistor M24 is provided near the corner of the fourth photodiode diffusion area pattern PD4 across a common diffusion area pattern connecting the third and fourth photodiode diffusion area patterns PD3 and PD4 to each other by extension.

The first, second, and third diffusion area patterns D1, D2, and D3 are provided for the gates of the reset transistor M25, the conversion transistor M26, and the selection transistor M27, respectively.

Although not shown in FIG. 6, after all processes are completed after forming the aforementioned gate patterns, first, second, third and fourth transmission control signals Tx01, Tx10, Tx21, and Tx30 are applied to the gates of the transmission transistors M21, M22, M23 and M24, respectively. In addition, a reset signal Rx is applied to the gate of the reset transistor M25. A common terminal of the transmission transistors M21, M22, M23 and M24 and a terminal of the reset transistor M25 are connected to the gate of the conversion transistor M26. A selection signal Sx is applied to the gate of the selection transistor M27.

Referring to FIGS. 6 and 7, the first transmission control signal Tx01 is applied to the gate of the first transmission transistor M21 located on the first horizontal line 0 and the second vertical line 1. The second transmission control signal Tx10 is applied to the second transmission transistor M22 located on the second horizontal line 1 and the first vertical line 0. The third transmission control signal Tx21 is applied to the gate of the third transmission transistor M23 located on the third horizontal line 2 and the second vertical line 1. The fourth transmission control signal Tx30 is applied to the gate of the fourth transmission transistor M24 located on the fourth horizontal line 3 and the first vertical line 0.

Referring to FIG. 6, the first, second, third, and fourth photodiodes PD1, PD2, PD3, and PD4 are used to detect a green component from the image signals applied to the image sensor if green color filters are provide on top of the corresponding photodiodes. This is reflected in a reference symbol G in parentheses. That is, four photodiodes of the 4T-4S step & repeat unit pixel of FIG. 6 according to the second embodiment may be used to detect a green component from the image signals. In this case, since all photodiodes of a single unit pixel are used to detect the same color component, i.e., a green component, it is possible to minimize data processing errors. Furthermore, it is possible to compensate for inconsistency of the patterns of four photodiodes to some extent.

In FIG. 6, all of the four photodiodes of the 4T-4S step & repeat unit pixel according to the second embodiment detect a green component. However, a red or blue component may be also detected from the image signals if a red or blue color filter is provided on top of the photodiodes of the 4T-4S step & repeat unit pixel according to the second embodiment. Although not shown in FIG. 6, an image sensor may detect blue and red components as well as a green component from image signals if blue and red color filters are appropriately provided on top of the photodiodes of a neighboring unit pixel adjacent to the unit pixel having only a green color filter on top of the photodiodes. For example, a blue color filter may be provided on top of the first and third photodiodes PD1 and PD3, and a red color filter may be provided on top of the second and fourth photodiodes PD2 and PD4.

In the neighboring unit pixel which has blue and red color filters appropriately provided on top of the photodiodes and is neighbored to the unit pixel having only a green color filter, the first, second, third, and fourth transmission control signal Tx01, Tx10, Tx21, and Tx30 will be applied to the gates of the first, second, third, and fourth transmission transistors, respectively.

Figure 8:
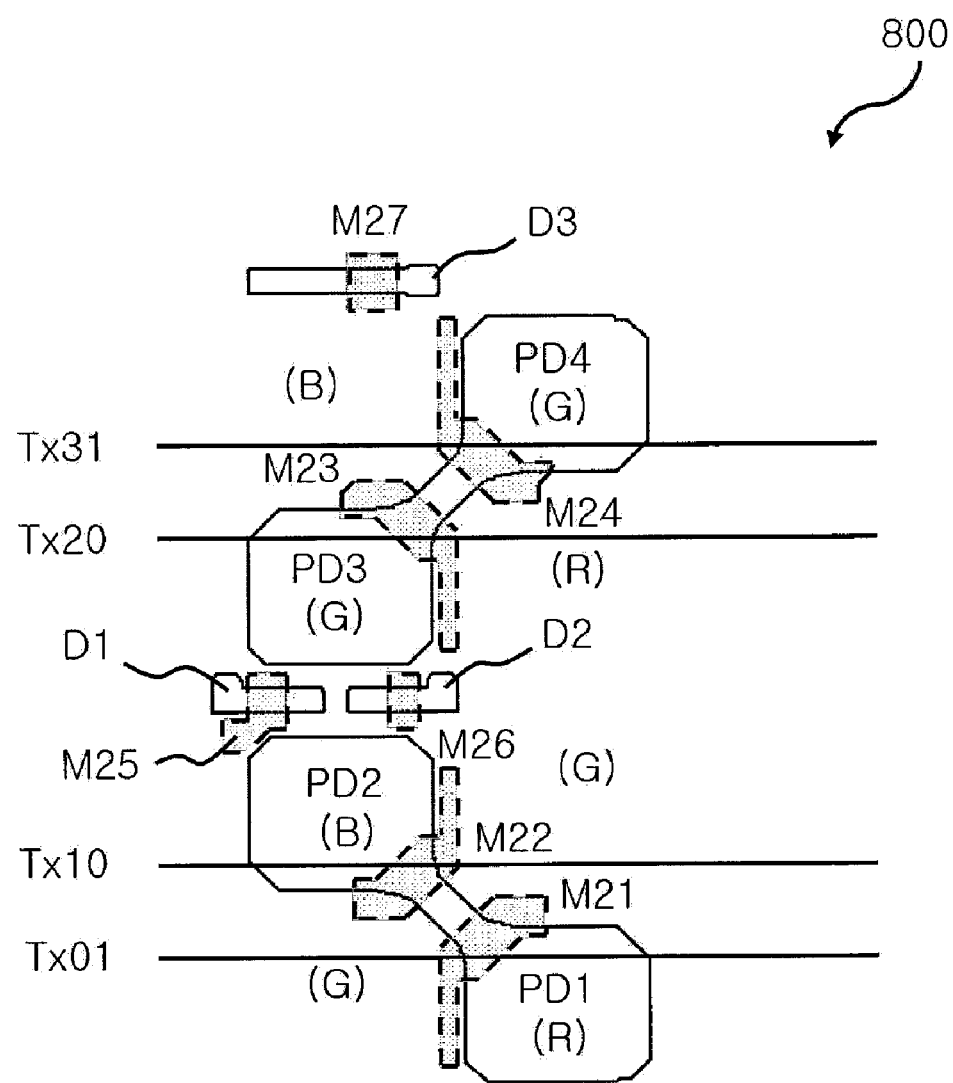
FIG. 8 is a layout of a 4T-4S step & repeat unit pixel according to the third embodiment of the present invention.

FIG. 8 is a layout of a 4T-4S step & repeat unit pixel according to the third embodiment of the present invention.

Figure 9:
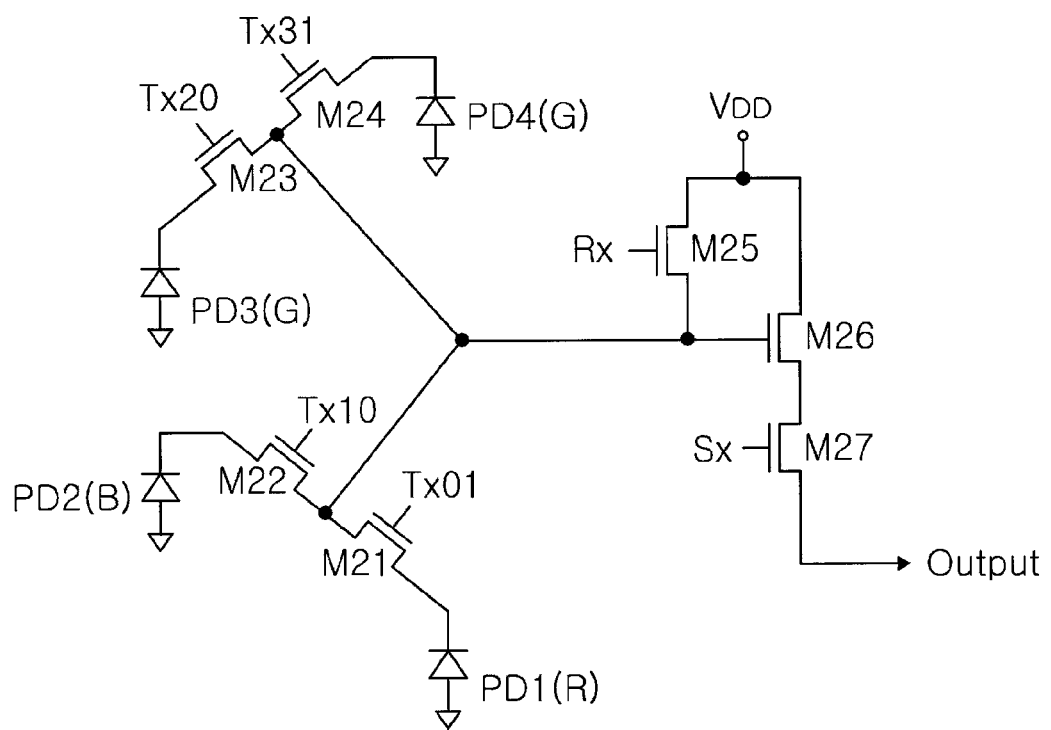
FIG. 9 is a circuit diagram of a 4T-4S step & repeat unit pixel of FIG. 8 according to the third embodiment.

FIG. 9 is a circuit diagram of the 4T-4S step & repeat unit pixel of FIG. 8 according to the third embodiment.

Referring to FIG. 8, the 4T-4S step & repeat unit pixel 800 according to the third embodiment is symmetrical to the 4T-4S step & repeat unit pixel of FIG. 4 according to the first embodiment with respect to a virtual y-axis connecting the first photodiode PD1 with the fourth photodiode PD4. Preferably, color filters are provided on top of corresponding photodiodes such that the first photodiode can detect a red component, the second photodiode PD2 can detect a blue component, and the third and fourth photodiodes PD3 and PD4 can detect a green component from image signals.

The first, second, third, and fourth transmission control signals Tx01, Tx10, Tx20, and Tx31 are applied to the gates of the first transmission transistor M21 located on the first horizontal line 0 and the second vertical line 1, the second transmission transistor M22 located on the second horizontal line 1 and the first vertical line 0, the third transmission transistor M23 located on the third horizontal line 2 and the first vertical line 0, and the fourth transmission transistor M24 located on the fourth horizontal line 3 and the second vertical line 1, respectively.

Since the locations of the photodiodes are symmetrical between the 4T-4S step & repeat unit pixels 400 and 800 of FIGS. 4 and 8 according to the first and third embodiments, the transmission control signals applied to the corresponding transmission transistors connected to the photodiodes are also different. That is, while the transmission control signals Tx01, Tx10, Tx20, and Tx31 are applied to the transmission transistors of FIG. 8, the transmission control signals Tx00, Tx11, Tx21, and Tx30 are applied to the transmission transistors of FIG. 4.

Figure 10:
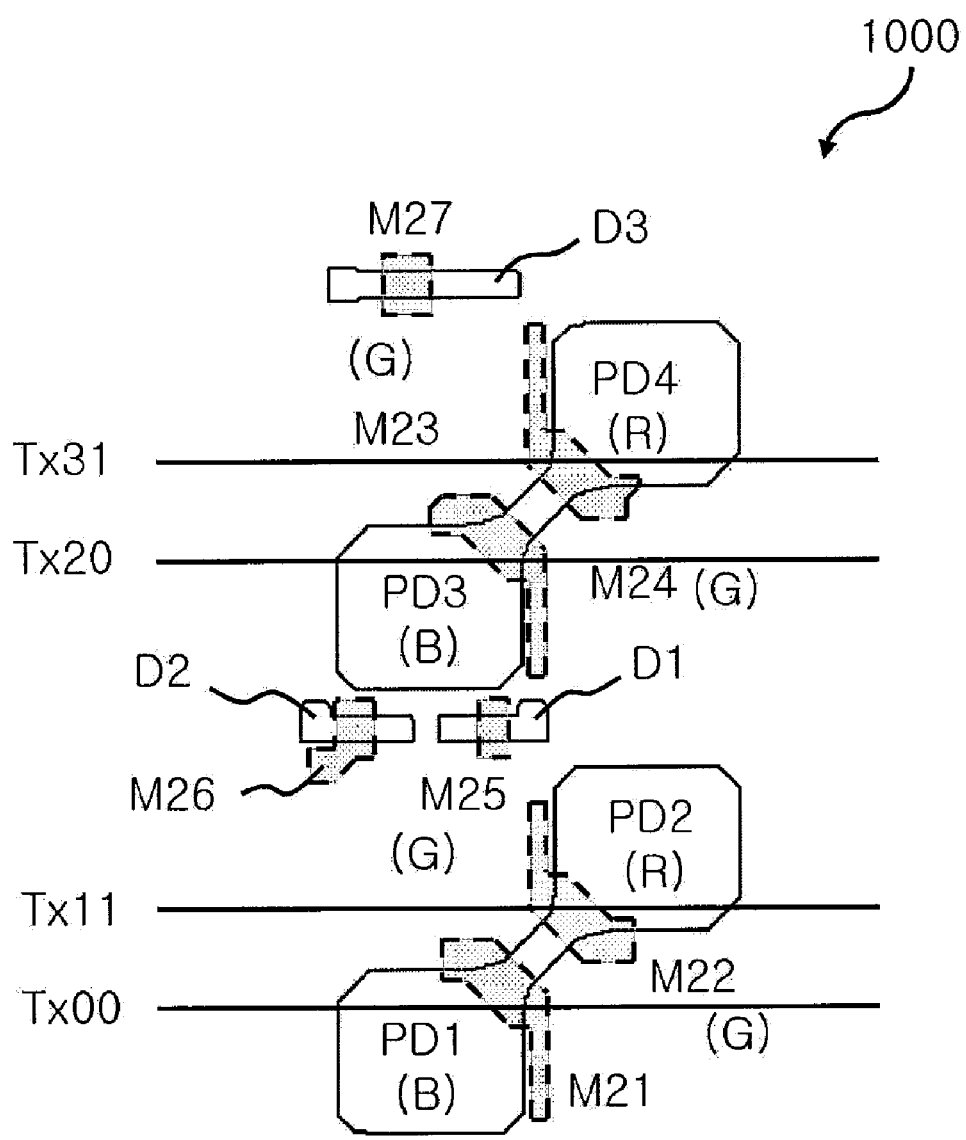
FIG. 10 is a layout of a 4T-4S step & repeat unit pixel according to the fourth embodiment of the present invention.

FIG. 10 is a layout of a 4T-4S step & repeat unit pixel according to the fourth embodiment of the present invention.

Figure 11:
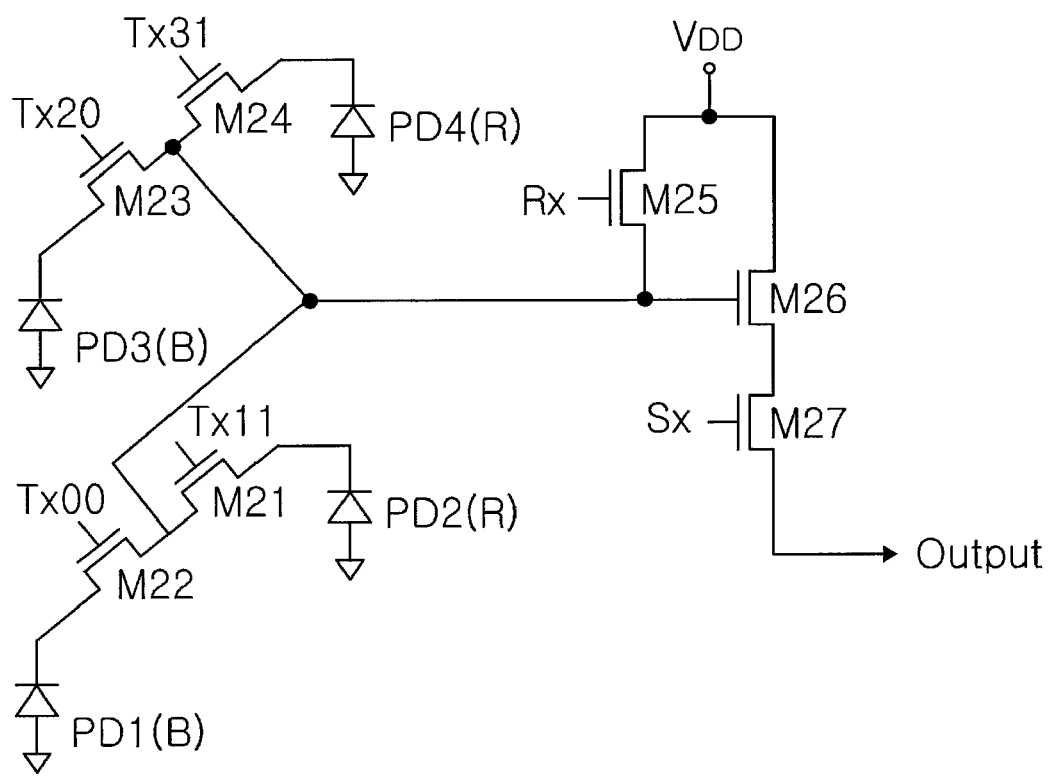
FIG. 11 is a circuit diagram of a 4T-4S step & repeat unit pixel of FIG. 10 according to the fourth embodiment.

FIG. 11 is a circuit diagram of the 4T-4S step & repeat unit pixel of FIG. 10 according to the fourth embodiment.

Referring to FIG. 10, the 4T-4S step & repeat unit pixel 1000 according to the fourth embodiment is symmetrical to the 4T-4S step & repeat unit pixel of FIG. 6 according to the second embodiment with respect to a virtual y-axis passing through the center of the drawing. Preferably, color filters are provided on top of corresponding photodiodes such that the first and third photodiodes PD1(B) and PD3(B) can detect a blue component, and the second and fourth photodiodes PD2(R) and PD4(R) can detect a red component from image signals.

The first, second, third, and fourth transmission control signals Tx00, Tx11, Tx20, and Tx31 are applied to the gates of the first transmission transistor M21 located on the first horizontal line 0 and the first vertical line 0, the second transmission transistor M22 located on the second horizontal line 1 and the second vertical line 1, the third transmission transistor M23 located on the third horizontal line 2 and the first vertical line 0, and the fourth transmission transistor M24 located on the fourth horizontal line 3 and the second vertical line 1, respectively.

Since the locations of the photodiodes are symmetrical between the 4T-4S step & repeat unit pixels of FIG. 6 and according to the second and fourth embodiments, the transmission control signals applied to the corresponding transmission transistors connected to the photodiodes are also different. That is, while the transmission control signals Tx00, Tx11, Tx20, and Tx31 are applied to the four transmission transistors of FIG. 10, the transmission control signals Tx01, Tx10, Tx21, and Tx30 are applied to the four transmission transistors of FIG. 6.

Figure 12:
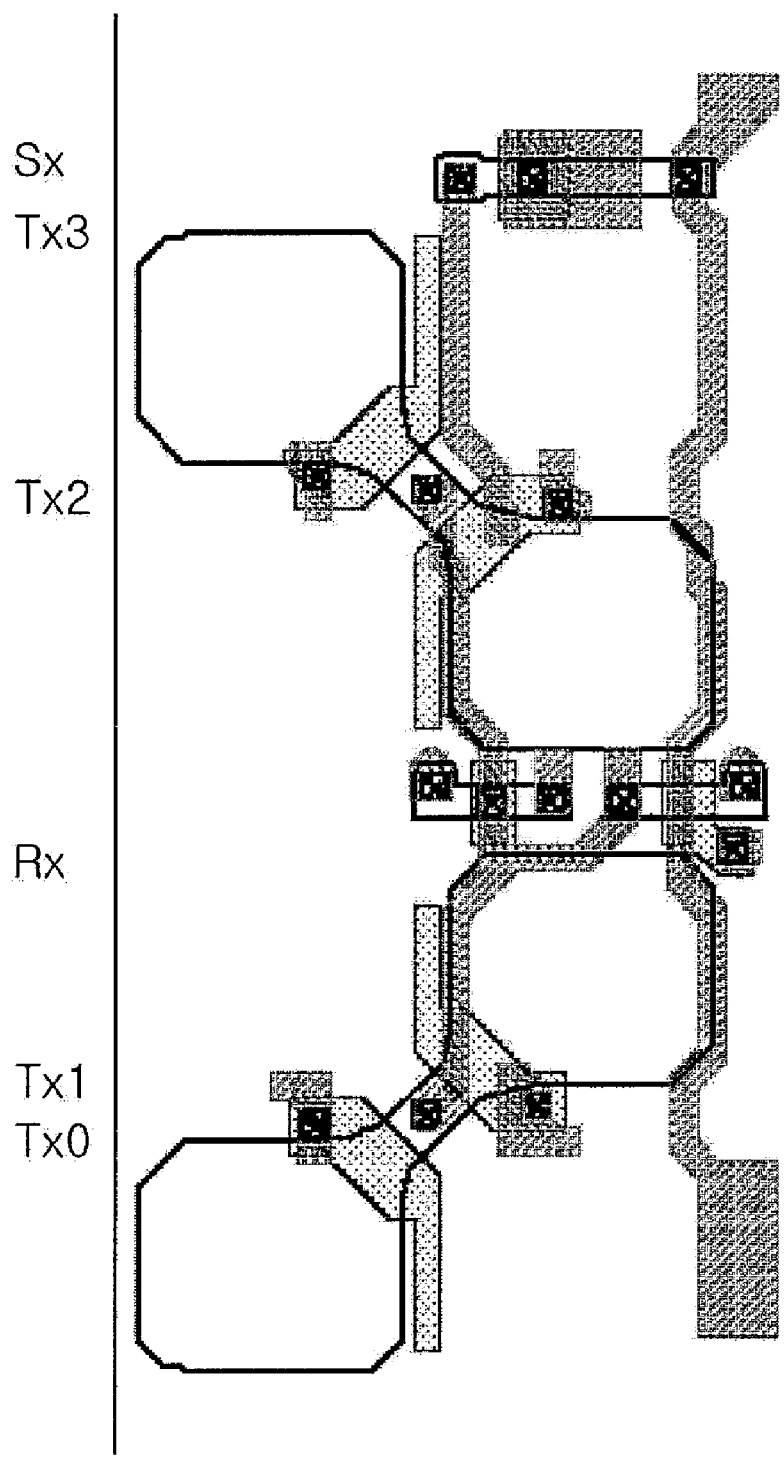
FIG. 12 is a layout of a 4T-4S step & repeat unit pixel in which contact regions and metal lines are further provided on an active diffusion area pattern and a gate layer of FIG. 5.

FIG. 12 is a layout of a 4T-4S step & repeat unit pixel in which contact regions and metal lines are further provided on an active diffusion area pattern and a gate layer of FIG. 5.

Figure 13:
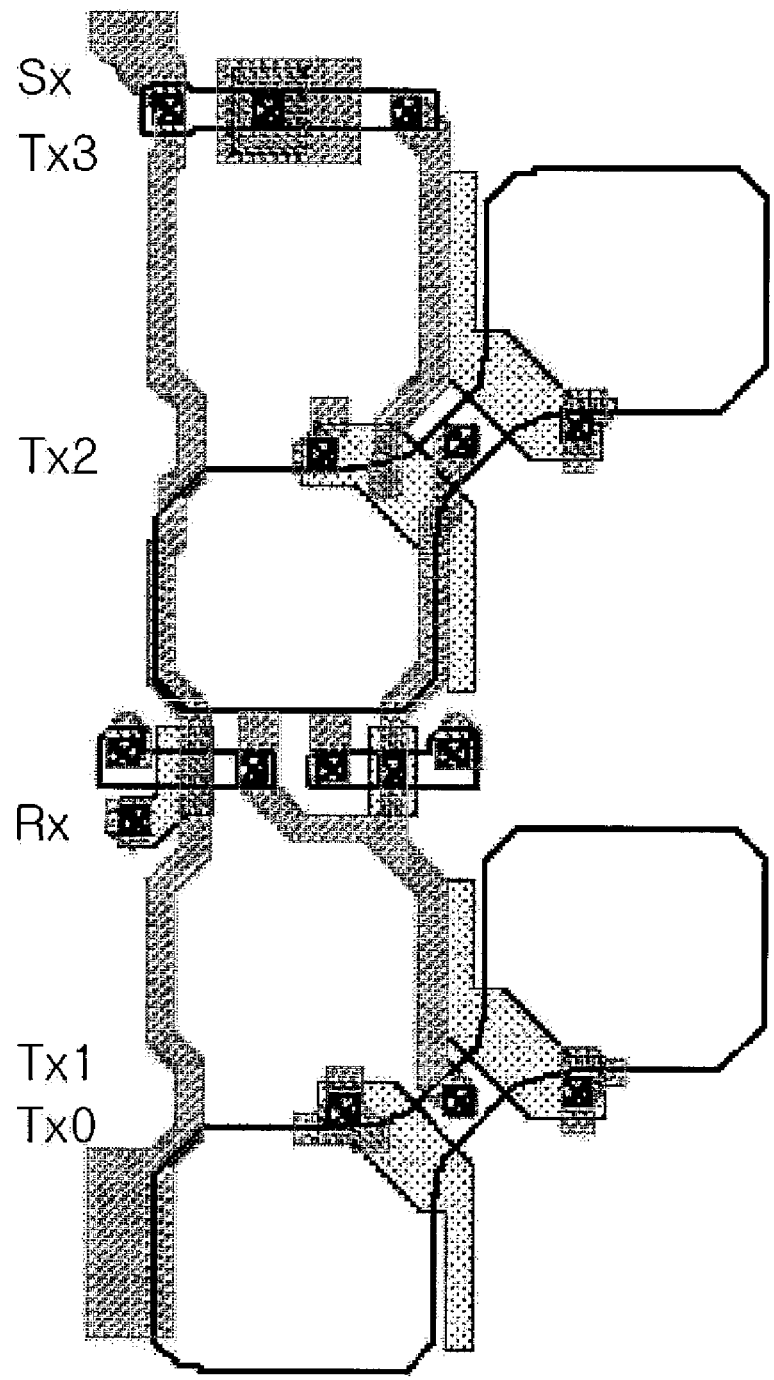
FIG. 13 is a layout of a 4T-4S step & repeat unit pixel in which contact regions and metal lines are further provided on an active diffusion area pattern and a gate layer of FIG. 7.

FIG. 13 is a layout of a 4T-4S step & repeat unit pixel in which contact regions and metal lines are provided on an active diffusion area pattern and a gate layer of FIG. 7.

Referring to FIGS. 12 and 13, the box with an X refers to a contact region, which will not be described in more detail as it would be apparent to those skilled in the art.

As described above, since four pixels share a common image signal conversion circuit having three transistors M25, M26, and M27, the number of transistors required for each pixel becomes 1.75. If other conditions are the same, the area that can be occupied by the photodiode increases in comparison to the case in which only two pixels commonly share a single image signal conversion circuit. This will improve the aperture ratio of the image sensor.

Since four photodiodes used to detect only a green component from image signals are processed by a single common image signal conversion circuit, it is possible to minimize data processing errors that can be generated when green components are detected from different unit pixels and processed. In addition, it is possible to apply the conventional recovery algorithm without change to any failed unit pixel to allow the failed pixel to be processed as if it normally operates.

While the present invention has been particularly shown and described with reference to exemplary embodiments thereof, it will be understood by those skilled in the art that various changes in form and details may be made therein without departing from the spirit and scope of the present invention as defined by the appended claims.

What is claimed is:

1. A 4 transistors and 4 shared step and repeat unit pixel comprising:
   a first photodiode diffusion area pattern;
   a second photodiode diffusion area pattern provided in an upper right diagonal direction from the first photodiode diffusion area pattern;
   a third photodiode diffusion area pattern provided above the second photodiode diffusion area pattern;
   a fourth photodiode diffusion area pattern provided in an upper left diagonal direction from the third photodiode diffusion area pattern over the first photodiode diffusion area pattern;
   a first diffusion area pattern provided between the second and third photodiode diffusion area patterns;
   a second diffusion area pattern provided between the second and third photodiode diffusion area pattern beside the first diffusion area pattern; and
   a third diffusion area pattern provided in a diagonal direction from the fourth photodiode diffusion area pattern over the third photodiode diffusion area pattern.

2. The 4 transistors and 4 shared step and repeat unit pixel according to claim 1,
- wherein most adjacent corners of the first and second photodiode diffusion area patterns are connected to each other by extension, and
- wherein most adjacent corners of the third and fourth photodiode diffusion area patterns are connected to each other by extension.

3. The 4 transistors and 4 shared step and repeat unit pixel according to claim 2,
- wherein a first transmission transistor is provided near the corner of the first photodiode diffusion area pattern and a second transmission transistor is provided near the corner of the second photodiode diffusion area pattern in a common diffusion area pattern connecting the first and second photodiode diffusion area patterns to each other by extension,
- wherein a third transmission transistor is provided near the corner of the third photodiode diffusion area pattern and a fourth transmission transistor is provided near the corner of the fourth photodiode diffusion area pattern in a common diffusion area pattern connecting the third and fourth photodiode diffusion area patterns to each other by extension, and
- wherein first, second, third, and fourth transmission control signals are applied to gates of the first, second, third, and fourth transmission transistors.

4. The 4 transistors and 4 shared step and repeat unit pixel according to claim 3,
- wherein the first transmission control signal enables a transmission transistor located on an nth horizontal line and an nth vertical line,
- wherein the second transmission control signal enables a transmission transistor located on an (n+1)th horizontal line and an (n+1) vertical line,
- wherein the third transmission control signal enables a transmission transistor located on an (n+2)th horizontal line and an (n+1)th vertical line, and
- wherein the fourth transmission control signal enables a transmission transistor located on an (n+3)th horizontal line and an nth vertical line, wherein n denotes any integer number.

5. The 4 transistors and 4 shared step and repeat unit pixel according to claim 1,
- wherein a reset transistor is implemented in the first diffusion area pattern, a conversion transistor is implemented in the second diffusion area pattern, and a reset transistor is implemented in the third diffusion area pattern, and
- wherein a select control signal is applied to a gate of the reset transistor, and a selection signal is applied to a gate of the selection transistor.

6. An image sensor comprising a plurality of 4 transistors and 4 shared step and repeat unit pixels arranged in horizontal and vertical directions, each of unit pixels having:
- a first photodiode diffusion area pattern;
- a second photodiode diffusion area pattern provided in an upper right diagonal direction from the first photodiode diffusion area pattern;
- a third photodiode diffusion area pattern provided above the second photodiode diffusion area pattern; and
- a fourth photodiode diffusion area pattern provided in an upper left diagonal direction from the third photodiode diffusion area pattern over the first photodiode diffusion area pattern,
- wherein a green color filter is provided on top of the first and second photodiode diffusion area patterns, a red color filter is provided on top of the third photodiode diffusion area pattern, and a blue color filter is provided on top of the fourth photodiode diffusion area pattern in one of the 4 transistors and 4 shared step and repeat unit pixels, and
- wherein a red color filter is provided on top of the first photodiode diffusion area pattern, a blue color filter is provided on top of the second photodiode diffusion area pattern, and a green color filter is provided on top of the third and fourth photodiode diffusion area patterns in another neighboring 4 transistors and 4 shared step and repeat unit pixel.

* * * * *